(12) United States Patent
Yoon

(10) Patent No.: US 12,021,524 B2
(45) Date of Patent: Jun. 25, 2024

(54) LEVEL SHIFTER AND GATE DRIVER INCLUDING THE LEVEL SHIFTER

(71) Applicant: LX Semicon Co., Ltd., Daejeon (KR)

(72) Inventor: Jang Hyun Yoon, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/956,608

(22) Filed: Sep. 29, 2022

(65) Prior Publication Data

US 2023/0108334 A1    Apr. 6, 2023

(30) Foreign Application Priority Data

Oct. 5, 2021    (KR) ........................ 10-2021-0131922

(51) Int. Cl.
| H03K 19/00 | (2006.01) |
| G09G 3/20 | (2006.01) |
| H03K 17/16 | (2006.01) |
| H03K 19/0185 | (2006.01) |

(52) U.S. Cl.
CPC ....... H03K 19/018521 (2013.01); G09G 3/20 (2013.01); H03K 17/168 (2013.01); H03K 19/018507 (2013.01); *G09G 2310/0267* (2013.01); *G09G 2310/0289* (2013.01)

(58) Field of Classification Search
CPC .............. H03K 3/0375; H03K 5/1534; H03K 19/018507; H03K 19/018521; H03K 17/168
See application file for complete search history.

(56) References Cited

U.S. PATENT DOCUMENTS

| 7,719,325 | B1* | 5/2010 | Wang ................... H03K 17/162 327/112 |
| 8,933,714 | B2* | 1/2015 | Akahane ............... H03K 17/145 324/705 |
| 9,350,352 | B2* | 5/2016 | Koike ............ H03K 19/018521 |
| 9,537,478 | B2* | 1/2017 | Takahashi ............... H01L 29/24 |
| 11,475,847 | B2* | 10/2022 | Lee ....................... G09G 3/3291 |
| 2010/0026361 | A1* | 2/2010 | Jung .............. H03K 19/018521 327/333 |
| 2012/0081149 | A1* | 4/2012 | Akahane ........ H03K 19/018521 326/80 |
| 2012/0229165 | A1* | 9/2012 | Tseng ............... H03K 19/00361 326/82 |
| 2014/0292392 | A1* | 10/2014 | Akahane ................ H03K 3/012 327/333 |
| 2018/0191340 | A1* | 7/2018 | Akahane .............. H03K 17/687 |

FOREIGN PATENT DOCUMENTS

| KR | 2011-0026812 A | 3/2011 |
| KR | 10-1113305 B1 | 3/2012 |
| KR | 10-1897227 B1 | 9/2018 |
| KR | 2019-0015095 A | 2/2019 |

\* cited by examiner

*Primary Examiner* — Tuan T Lam
(74) *Attorney, Agent, or Firm* — POLSINELLI PC

(57) ABSTRACT

A level shifter includes a converter configured to generate a first driving signal and a second driving signal; a current sensing circuit configured to detect a current corresponding to a voltage change of second power, and generate a freezing signal according to the current; a freezing circuit configured to control an operation of the converter according to the freezing signal.

16 Claims, 7 Drawing Sheets

LEVEL SHIFTER AND GATE DRIVER INCLUDING THE LEVEL SHIFTER

BACKGROUND

1. Technical Field

Various embodiments generally relate to a level shifter for generating a gate driver provided to a display panel and a gate driver including the level shifter.

2. Related Art

A Display apparatus may include a gate driver for providing a gate signal to a display panel, the gate driver may include a level shifter. The level shifter is a circuit which converts an on/off signal, as a control signal having a low level, into a high or low voltage level in a high-side gate driver circuit. In order to drive a switching element such as a high-side IGBT (insulated gate bipolar transistor) or MOSFET, a pulse transformer with a simple structure and a low cost has been mainly used in the past. However, since the pulse transformer has a disadvantage in that an operating speed is slow, a level shifter has been mainly applied to a high-side gate driver circuit in recent years.

Such a conventional level shifter receives, as input signals, pulse signals having different phases, converts the levels thereof, and thereby, generates two output signals. The output signals are applied to the latch circuit of the high-side gate driver circuit. When a Common mode noise is applied to a common source, due to an abrupt driving voltage rise by the short circuit of the common source, the level shifter may simultaneously generate two output signals having high levels. Accordingly, there is a problem in that a malfunction may occur in the high-side gate driver circuit. As described above, the conventional level shifter is vulnerable to the common mode noise. And, when the size of a high voltage transistor of the level shifter is increases for a high-speed operation, a current may be increased. In this case, due to the increase in the size of the high voltage transistor, parasitic capacitance increases and the propagation delay increases.

SUMMARY

Various embodiments are directed to preventing a malfunction a level shifter of a high-side gate driver circuit due to a common mode noise.

Various embodiments are directed to having characteristics of high-speed operation, low power consumption, and low propagation delay.

In an embodiment, a level shifter may comprise: a first resistor and a first transistor which are connected between first power and second power and generate a first voltage; a second resistor and a second transistor which are connected between the first power and the second power and generate a second voltage; a converter configured to generate the first driving signal by using the first voltage of a first node between the first resistor and the first transistor and the second driving signal by using the second voltage of the second node between the second resistor and the second transistor; a current sensing circuit configured to detect a voltage change of the second driving voltage of the second power, and generate a freezing signal according to the voltage change; and a freezing circuit configured to control an operation of the converter according to the freezing signal, wherein a gate voltage is provided in response to the first driving signal and the second driving signal.

In an embodiment, a gate driver may comprise: a pulse generator configured to generate a first pulse signal in synchronization with a first input signal and a second pulse signal in synchronization with a second input signal; and a level shifter configured to generate a first driving signal and a second driving signal corresponding to the first pulse signal and the second pulse signal, wherein the level shifter may include: a first resistor and a first transistor which are connected between first power and second power and generate a first voltage; a second resistor and a second transistor which are connected between the first power and the second power and generate a second voltage; a converter configured to generate the first driving signal by using the first voltage of a first node between the first resistor and the first transistor and the second driving signal by using by using the second voltage of the second node between the second resistor and the second transistor; a SR latch configured to generate a gate voltage according to the first driving signal and the second driving signal; a current sensing circuit configured to detect a voltage change of the second driving voltage of the second power, and generate a freezing signal according to the voltage change; and a freezing circuit configured to control an operation of the converter according to the freezing signal, wherein the first transistor receives the first pulse signal and the second transistor receives the second pulse signal.

Accordingly, the gate driver according to the embodiments achieves an effect of being able to prevent a malfunction of a high-side gate driver circuit due to an unintentional instantaneous common mode noise.

In addition, the level shifter and the gate driver according to embodiments may achieve an effect of being able to implement high-speed operation without increasing the size of the high-voltage transistor by detecting voltage change and providing a bypass path, and implement low power consumption and low propagation delay.

DETAILED DESCRIPTION

Figure 1:
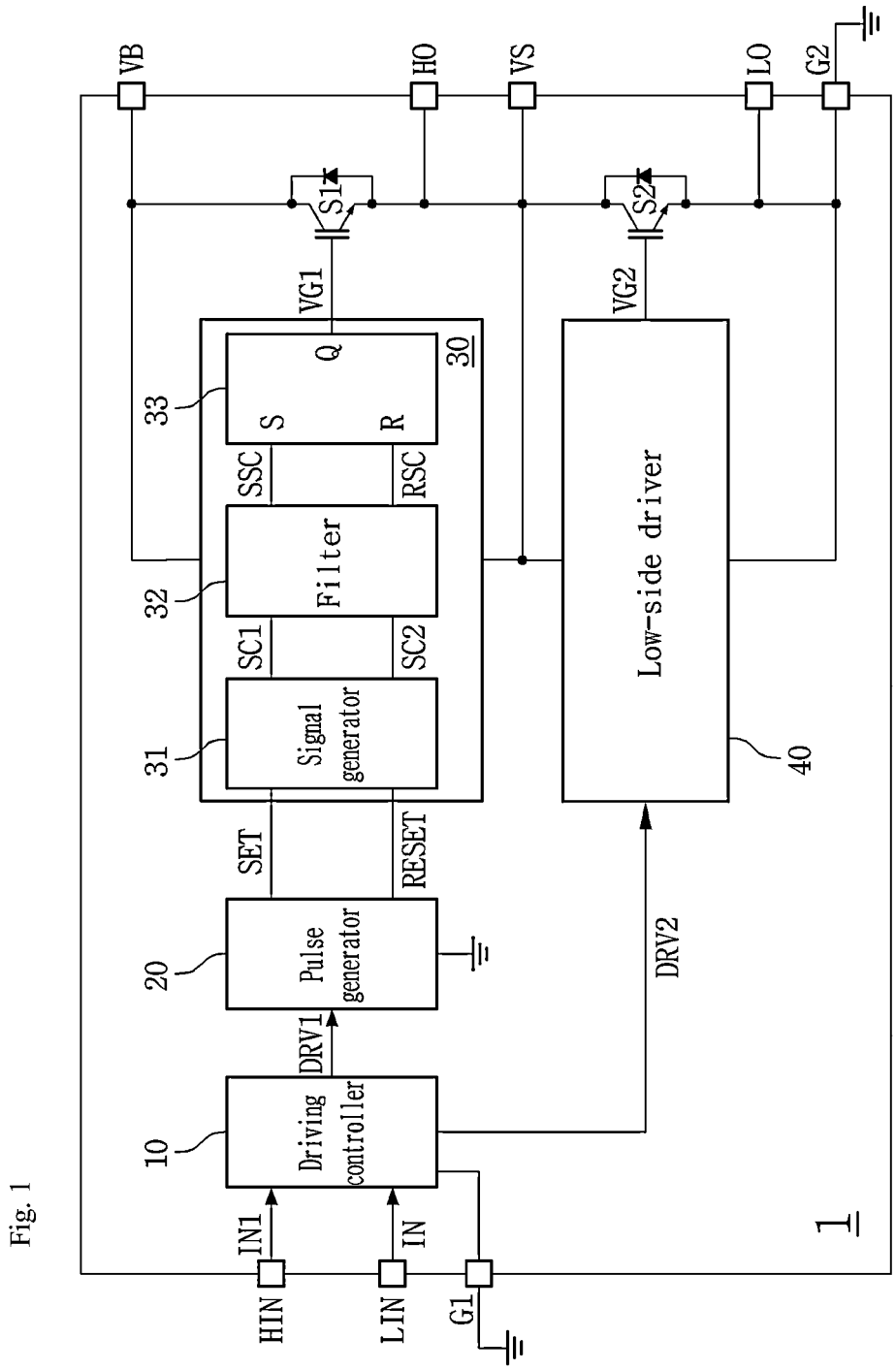
FIG. 1 is a diagram illustrating a gate driver in accordance with an embodiment.

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

Hereinafter, a gate driver in accordance with an embodiment will be described with reference to FIGS. 1 and 2.

FIG. 1 is a diagram illustrating a gate driver in accordance with an embodiment.

Referring to FIG. 1, a gate driver 1 may include a driving controller 10, a pulse generator 20, a level shifter 30, and a low-side driver 40. It may be understood that the level shifter 30 is corresponded to a high-side driver.

The driving controller 10 may receive an external first input signal IN1 and an external second input signal IN2 through input terminals HIN and LIN, generate a first driving control signal DRV1. The driving controller 10 may control the driving of the level shifter 30 using the first driving control signal DRV1. The driving controller 10 may generate a second driving control signal DRV2 corresponding to the external first input signal IN1 and the external second input signal IN2 and control the driving of the low-side driver 40 using the second driving control signal DRV2.

The pulse generator 20 may generate a plurality of pulse signals according to the first driving control signal DRV1. For example, the pulse generator 20 may generate a first pulse signal SET in synchronization with a time point at which the output of a first input signal IN1 rises from a low level to a high level, and may generate a second pulse signal RESET in synchronization with a time point at which the output of a second input signal IN falls from a high level to a low level.

The level shifter 30 may be supplied with first power VB and second power VS for a high-side driving. A voltage by the first power VB may be defined as a first driving voltage, and a voltage by the second power VS may be defined as a second driving voltage. The second driving voltage may be set to have a lower than the first driving voltage. The level shifter 30 may generate a first gate voltage VG1 using the first pulse signal SET and the second pulse signal RESET. The level shifter 30 may control the switching operation of a high-side output switch S1 using the first gate voltage VG1. The high-side output switch S1 may output a high-side output HO. When the second driving voltage of the second power VS rises with a steep slope (a high dv/dt), the level shifter 30 may generate a bypass path so that the first driving signal SC1 of a high level and the second driving signal SC2 of a high level are not simultaneously generated in a signal generator 31.

The level shifter 30 may include the signal generator 31, a filter 32 and an SR latch 33.

The signal generator 31 may generate the first driving signal SC1 and the second driving signal SC2 using the first pulse signal SET and the second pulse signal RESET.

The signal generator 31 may include two transistors. The signal generator 31 may generate the first driving signal SC1 and the second driving signal SC2 in correspondence to the switching operations of the two transistors. The first driving signal SC1 becomes a predetermined high level when a corresponding transistor is turned on, and becomes a predetermined low level when the corresponding transistor is turned off. The second driving signal SC2 becomes a predetermined high level when a corresponding transistor is turned on, and becomes a predetermined low level when the corresponding transistor is turned off. The signal generator 31 may generate a bypass path in a voltage change of the second driving voltage of the second power VS due to the common mode noise so that a latch circuit(33) does not malfunction. A detailed method for the signal generator 31 to generate a bypass path will be described later.

The filter 32 may remove the noise of the first driving signal SC1 and the second driving signal SC2. The filter 32 may generate a set driving signal SSC by filtering the noise of the first driving signal SC1. The filter 32 may transfer the set driving signal SSC to a set terminal S of the SR latch 33. The filter 32 may generate a reset driving signal RSC by filtering the noise of the second driving signal SC2. The filter 32 may transfer the reset driving signal RSC to a reset terminal R of the SR latch 33.

The SR latch 33 is a latch circuit which includes the set terminal S, the reset terminal R and an output terminal Q. The set driving signal SSC is inputted to the set terminal S, and the reset driving signal RSC is inputted to the reset terminal RS. The SR latch 33 may output the first gate voltage VG1 as an output signal to the output terminal Q according to the set driving signal SSC and the reset driving signal RSC. For example, when the set driving signal SSC of a high level is applied to the set terminal S, the SR latch 33 may store a voltage of a high level as data and output the first gate voltage VG1 of a high level. The SR latch 33 may maintain the stored data of a high level. When the reset driving signal RSC of a high level is applied to the reset terminal R, the SR latch 33 may initialize stored data and output the first gate voltage VG1 of a low level The low-side driver 40 may generate a second gate voltage VG2 according to the second driving control signal DRV2. The low-side driver 40 may control the switching operation of a low-side output switch S2 using the second gate voltage VG2.

Hereinbelow, a level shifter 30 in accordance with an embodiment will be described with reference to FIG. 2.

Figure 2:
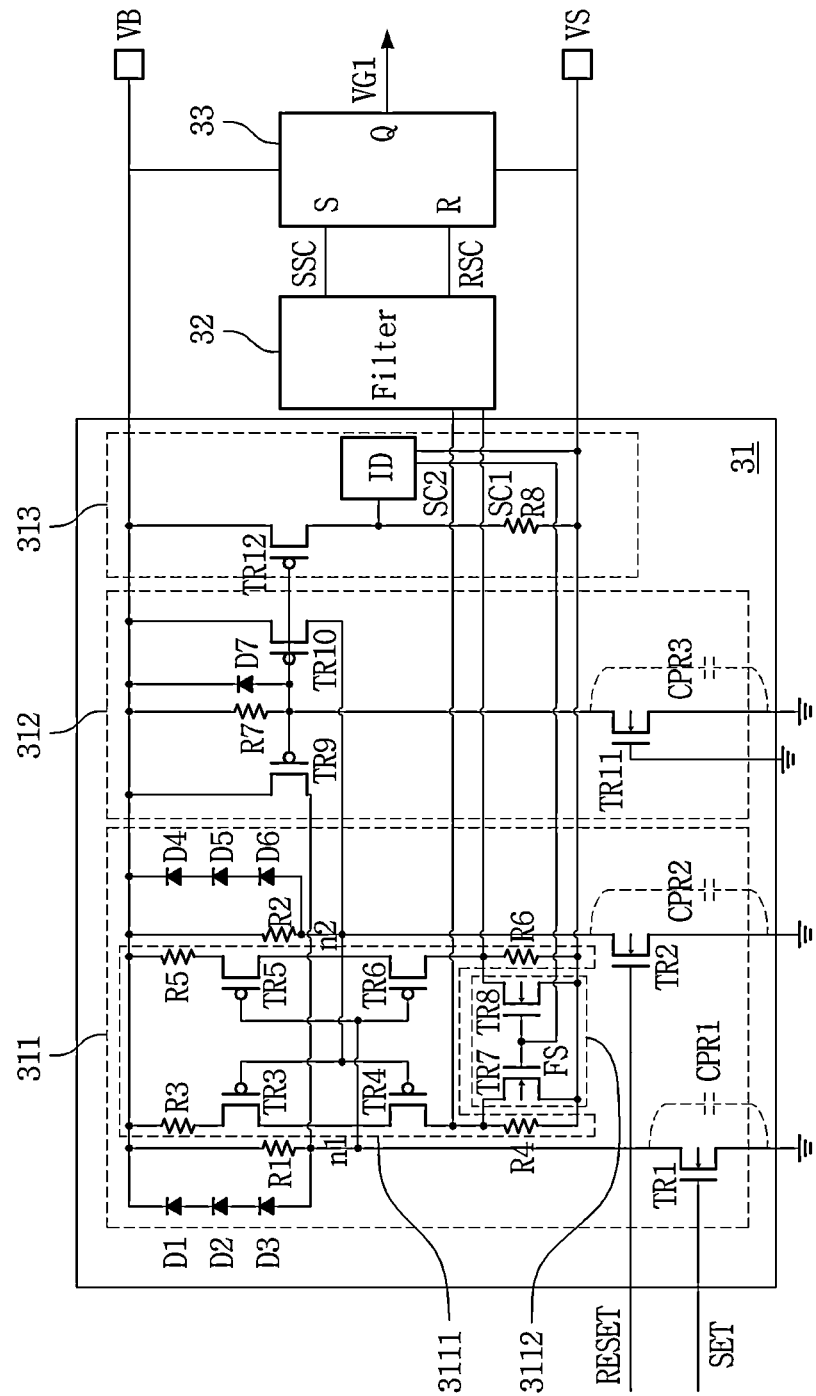
FIG. 2 is a block diagram illustrating the configuration of a level shifter in accordance with an embodiment.

FIG. 2 is a block diagram illustrating the configuration of a level shifter 30 in accordance with an embodiment.

Referring to FIG. 2, the signal generator 31 includes a signal generation circuit 311, a path forming circuit 312, and a current sensing circuit 313.

The signal generation circuit 311 may generate the first driving signal SC1 and the second driving signal SC2 using the first pulse signal SET and the second pulse signal RESET. The signal generation circuit 311 may include first and second transistors TR1 and TR2, first and second resistors R1 and R2, first to sixth diodes D1 to D6, a converter 3111, and a freezing circuit 3112. A first node n1 may be formed between the first resistor R1 and the first transistor TR1, and a second node n2 may be formed between the second resistor R2 and the second transistor TR2.

The first transistor TR1 includes a drain which is connected to the first node n1, a source which is connected to a ground and a gate to which the first pulse signal SET is applied, and is switched according to the signal level of the first pulse signal SET. A first parasitic capacitor CPR1 may be formed between the drain and the source of the first transistor TR1. The first transistor TR1 may be an NMOS transistor.

The second transistor TR2 includes a drain which is connected to the second node n2, a source which is connected to the ground and a gate to which the second pulse signal RESET is applied, and is switched according to the signal level of the second pulse signal RESET. A second parasitic capacitor CPR2 may be formed between the drain and the source of the second transistor TR2. The second transistor TR2 may be an NMOS transistor.

The first resistor R1 is connected between the first power VB and the first node n1. The second resistor R2 is connected between the first power VB and the second node n2.

The first to third diodes D1 to D3 are connected in series between the first power VB and the first node n1. The fourth to sixth diodes D4 to D6 are connected in series between the first power VB and the second node n2. The first to sixth diodes D1 to D6 may operate as a clamping circuit, and may be configured by, but not limited to, Zener diodes.

The converter 3111 may control to generate the first driving signal SC1 and the second driving signal SC2 using the voltage of the first node n1 and the voltage of the second node n2. The converter 3111 includes third to sixth transistors TR3 to TR6, and third to sixth resistors R3 to R6. The third to sixth transistors TR3 to TR6 may be an PMOS transistor.

The third transistor TR3 and the fourth transistor TR4 are connected in series between the first power VB and the second power VS, and a drain of the third transistor TR3 is connected to a source of the fourth transistor TR4. Gates of the third transistor TR3 and the fourth transistor TR4 are connected to the second node n2.

The fifth transistor TR5 and the sixth transistor TR6 are connected in series between the first power VB and the second power VS, and a drain of the fifth transistor TR5 is connected to a source of the sixth transistor TR6. Gates of the fifth transistor TR5 and the sixth transistor TR6 are connected to the first node n1.

The third resistor R3 is connected between the first power VB and a source of the third transistor TR3. The fourth resistor R4 is connected between a drain of the fourth transistor TR4 and the second power VS. The fifth resistor R5 is connected between the first power VB and a source of the fifth transistor TR5. The sixth resistor R6 is connected between a drain of the sixth transistor TR6 and the second power VS.

The freezing circuit 3112 may include a seventh transistor TR7 and an eighth transistor TR8, and may control the operation of the converter 3111 according to a freezing signal FS of the current sensing circuit 313. The seventh to eighth transistors TR7 to TR8 may be an NMOS transistor.

The seventh transistor TR7 is connected in parallel to the fourth resistor R4. That is, the seventh transistor TR7 is connected between the source of the fourth transistor TR4 and the second power VS. The eighth transistor TR8 is connected in parallel to the sixth resistor R6. That is, the eighth transistor TR8 connected between the source of the sixth transistor TR6 and the second power VS.

The path forming circuit 312 may form bypass paths for the first node n1 and the second node n2. That is, the path forming circuit 312 may form a bypass path (see FIG. 5) so that a current corresponding to a voltage change does not flow through the first resistor R1 and/or the second resistor R2. A detailed method for the path forming circuit 312 to form a bypass path when a voltage change of the second driving voltage occurs will be described later.

The path forming circuit 312 includes ninth to eleventh transistors TR9 to TR11, a seventh resistor R7, and a seventh diode D7. The ninth to tenth transistors TR9 to TR10 may be a PMOS transistor and the eleventh transistor TR11 may be an NMOS transistor.

The ninth transistor TR9 includes a source which is connected to the first power VB, a gate which is connected to a gate of the tenth transistor TR10, and a drain which is connected to the first node n1.

The tenth transistor TR10 includes a source which is connected to the first power VB, the gate which is connected to the gate of the ninth transistor TR9, and a drain which is connected to the second node n2.

The eleventh transistor TR11 includes a drain which is connected to the gates of the ninth transistor TR9 and the tenth transistor TR10, a gate, and a source which is connected to the ground. A third parasitic capacitor CPR3 may be formed between the drain and the source of the eleventh transistor TR11.

The seventh resistor R7 is connected between the first power VB and the gates of the ninth transistor TR9 and the tenth transistor TR10.

The seventh diode D7 includes a cathode which is connected to the first power VB and an anode which is connected to the gates of the ninth transistor TR9 and the tenth transistor TR10.

The current sensing circuit 313 senses a current Is (see FIG. 5) corresponding to a change of the second driving voltage of the second power VS, and outputs the freezing signal FS. The current sensing circuit 313 includes an eighth resistor R8, a current sensing part ID, and a twelfth transistor TR12. The twelfth transistor TR12 may be a PMOS transistor.

The eighth resistor R8 is connected between a drain of the twelfth transistor TR12 and the second power VS. The eighth resistor R8 may be a sensing resistor which senses a voltage change of the second driving voltage in correspondence to a voltage change of the second power VS.

The current sensing part ID is connected to both ends of the eighth resistor R8. The current sensing part ID detects the current Is corresponding to a voltage change, and outputs the freezing signal FS. For example, when the current Is is detected, the current sensing part ID may determine that a voltage change of the second driving voltage has occurred in the second power VS due to the common mode noise, and may generate the freezing signal FS of an enable level (for example, a high level).

The twelfth transistor TR12 includes a source which is connected to the first power VB, a gate which is connected to the gates of the ninth transistor TR9 and the tenth transistor TR10, and a drain which is connected to one end of the eighth resistor R8.

Hereinafter, a normal state operation of the level shifter 30 in accordance with the embodiment will be described with reference to FIGS. 2 and 3.

Figure 3:
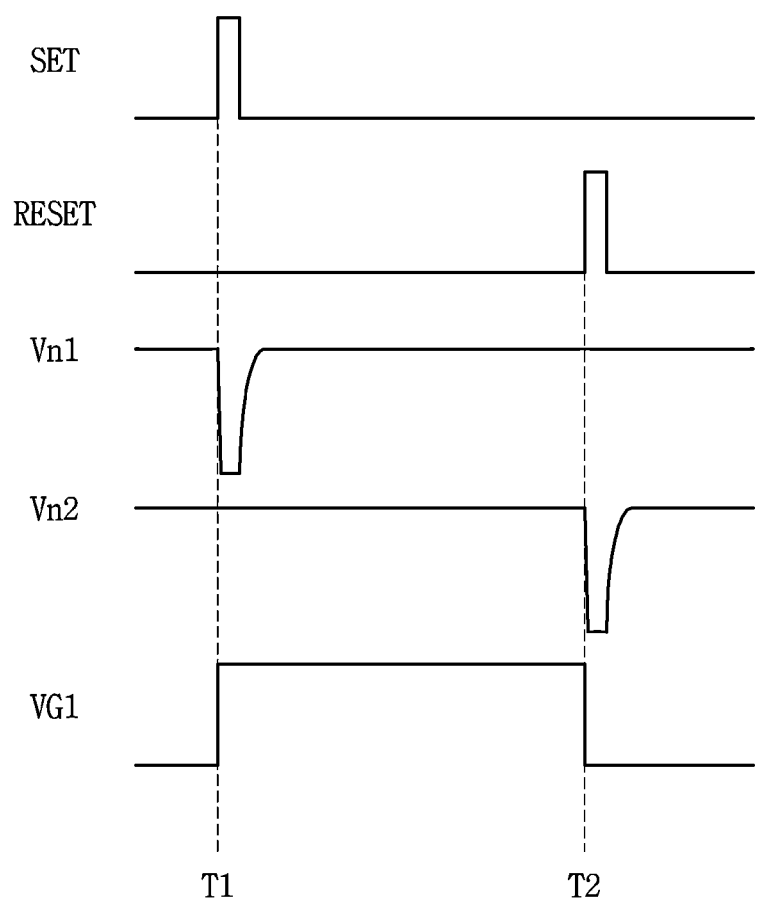
FIG. 3 is a timing diagram illustrating the operation of the level shifter in accordance with the embodiment.

FIG. 3 is a timing diagram illustrating the operation of the level shifter 30 in accordance with the embodiment.

Referring to FIGS. 2 and 3, at a first time point T1, the first pulse signal SET of a high level is applied to the gate of the first transistor TR1, and the first transistor TR1 is turned on. The ground and the first node n1 are connected through the first transistor TR1, and a voltage Vn1 of the first node n1 drops to a low level. The fifth transistor TR5 and the sixth transistor TR6 are turned on according to the first voltage Vn1 of a low level of the first node n1, and the first driving signal SC1 of a high level is generated. Accordingly, at the first time point T1, the set driving signal SSC corresponding to the first driving signal SC1 of the high level is applied to the SR latch, and the first gate voltage VG1 is changed from a low level to a high level.

At a second time point T2, the second pulse signal RESET of a high level is applied to the gate of the second transistor TR2, and the second transistor TR2 is turned on. The ground and the second node n2 are connected through the second transistor TR2, and a voltage Vn2 of the second node n2 drops to a low level. The third transistor TR3 and the fourth transistor TR4 are turned on according to the second voltage Vn2 of a low level of the node n2, and the second driving signal SC2 of a high level is generated. Accordingly, at the second time point T2, the reset driving signal RSC corresponding to the second driving signal SC2 of the high level is applied to the SR latch, and the first gate voltage VG1 is changed from a high level to a low level.

Hereinafter, a method for the level shifter in accordance with the embodiment to prevent a malfunction of the SR latch 33 when a second driving voltage rises with a steep slope due to the common mode noise will be described with reference to FIGS. 4 to 6.

Figure 4:
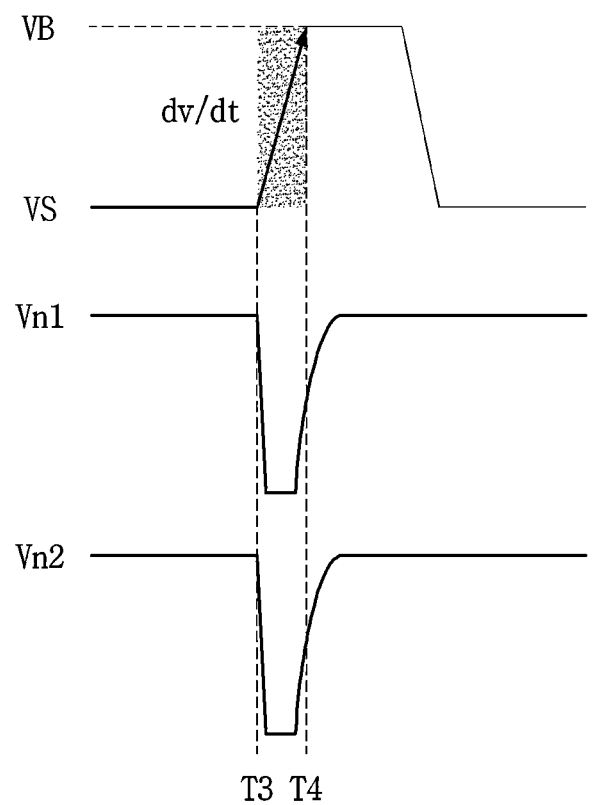
FIG. 4 is a timing diagram illustrating a voltage change when a driving voltage of a second power VS rises with a steep slope due to a common mode noise in the level shifter in accordance with the embodiment.

FIG. 4 is a timing diagram illustrating a voltage change when a second driving voltage of the second power VS rises with a steep slope in the level shifter in accordance with the embodiment.

Figure 5:
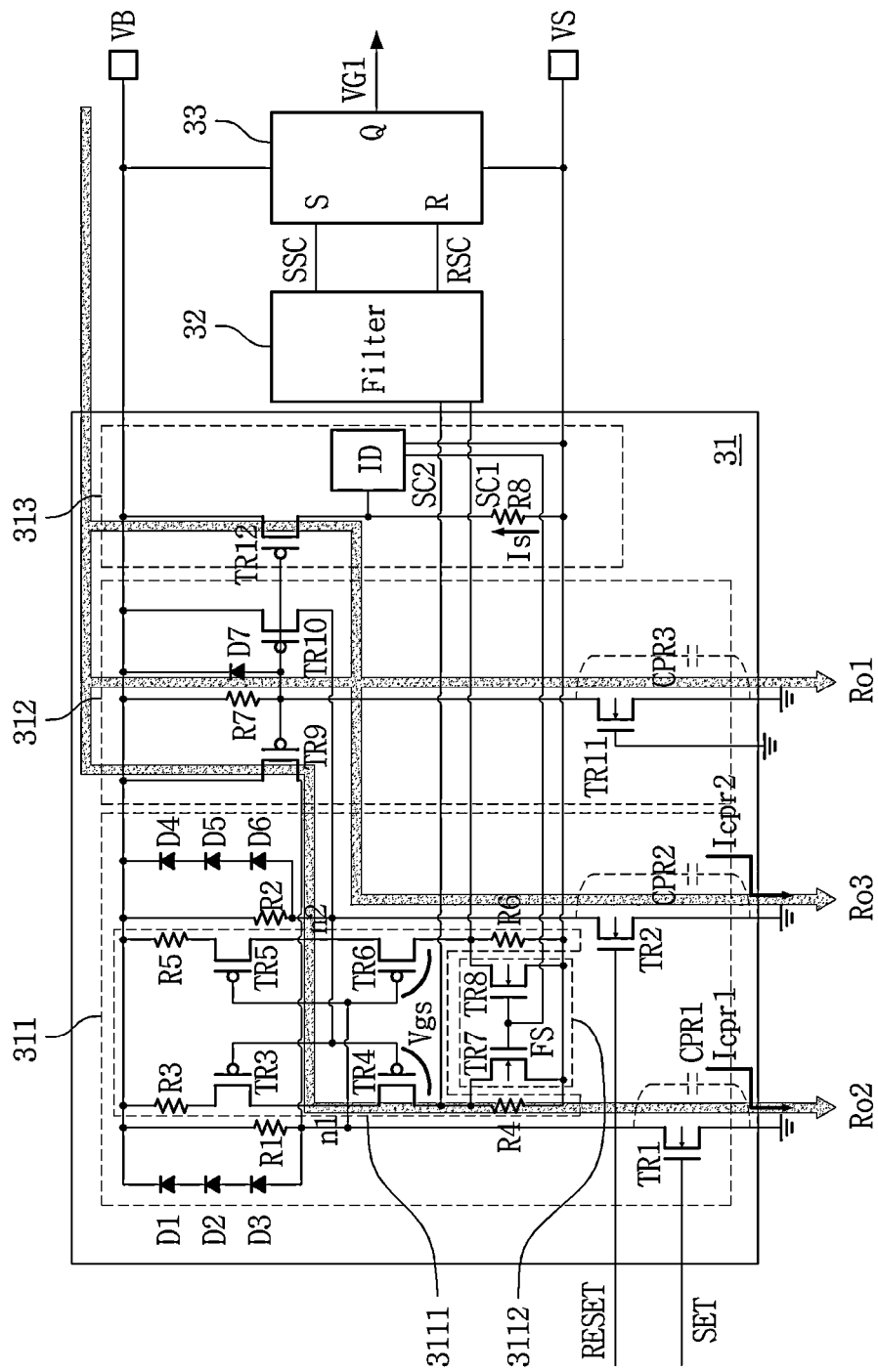
FIG. 5 is a diagram illustrating a bypass path in accordance with the embodiment.

FIG. 5 is a diagram illustrating a bypass path in accordance with the embodiment.

Figure 6:
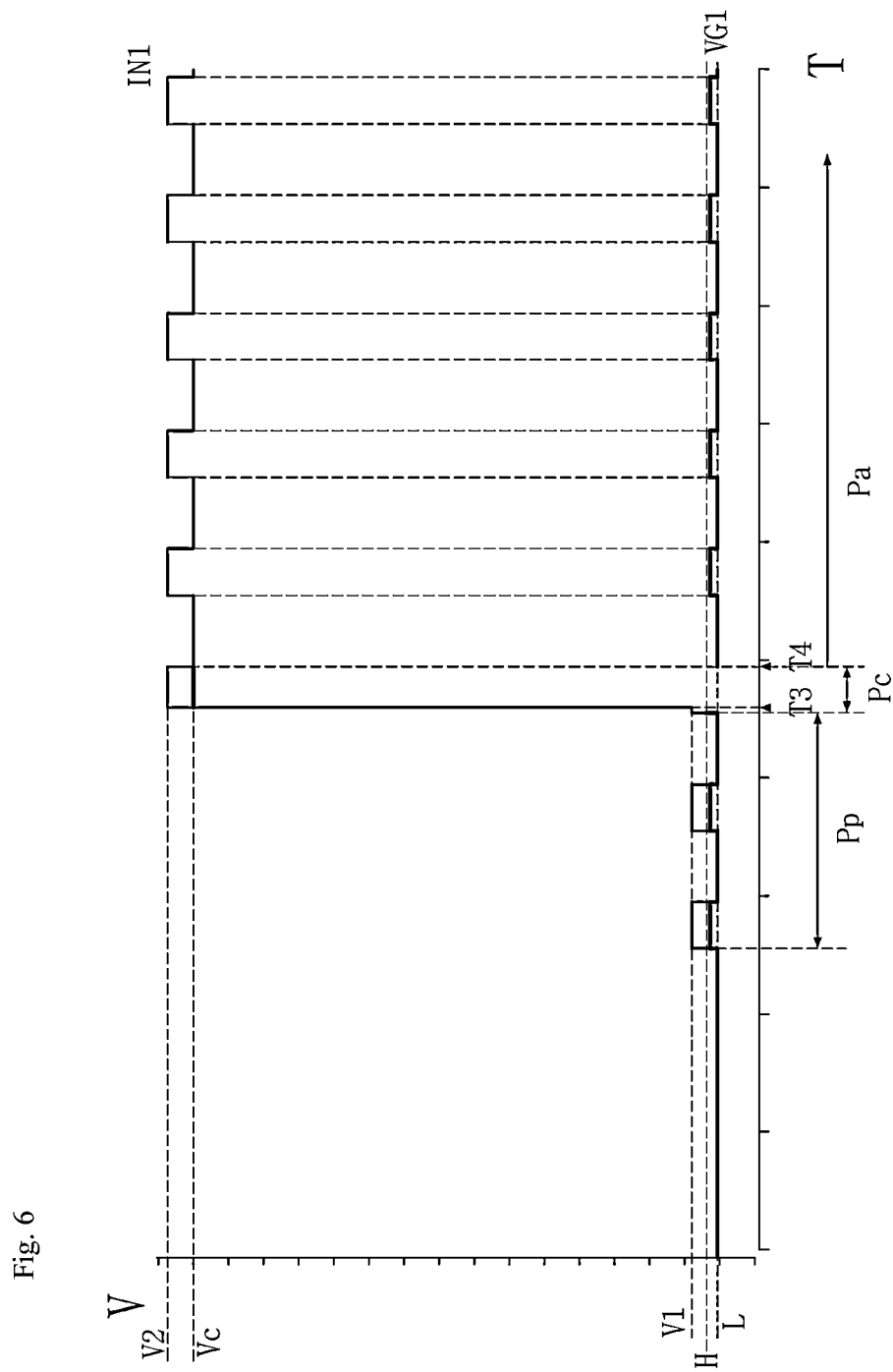
FIG. 6 is a graph showing the malfunction prevention effect of the level shifter in accordance with the embodiment.

FIG. 6 is a graph showing the malfunction of the SR latch 33 prevention effect of the level shifter 30 in accordance with the embodiment.

Referring to FIGS. 4, when the common mode noise is applied to the second power VS, the second driving voltage of the second power VS may rise with a steep slope (a high dv/dt) between a third time point T3 and a fourth time point T4. In response to such a voltage change of the second driving voltage, the first parasitic capacitor CPR1, the second parasitic capacitor CPR2 and the third parasitic capacitor CPR3 are charged.

According to a current Icpr1 flowing from the charged first parasitic capacitor CPR1 to the ground and a current Icpr2 flowing from the charged second parasitic capacitor CPR2 to the ground, at the third time point T3, the first voltage Vn1 of the first node n1 and the second voltage Vn2 of the second node n2 simultaneously drop to low levels. Accordingly, the fifth transistor TR5 and the sixth transistor TR6 are turned on and the first driving signal SC1 of a high level is generated, and the third transistor TR3 and the fourth transistor TR4 are turned on and the second driving signal SC2 of a high level is generated. In response to the first driving signal SC1 of a high level and the second driving signal SC2 of a high level, the set driving signal SSC of a high level is applied to the set terminal S of the SR latch 33, and the reset driving signal RSC of a high level is applied to the reset terminal R of the SR latch 33. Therefore, the SR latch 33 malfunctions.

At the third time point T3, the current sensing circuit 313 may sense the current Is flowing across the eighth resistor R8 in response to dv/dt of the second driving voltage of the second power VS. At this time, the current IS of the resistor R8 is sensed by the current sensing part ID of the current sensing circuit 313, and the current sensing circuit 313 may output the freezing signal FS corresponding to the current IS. That, the current sensing circuit 313 may generate the freezing signal FS of an enable level, for example, a high level, in response to the sensed current Is. According to the freezing signal FS of a high level, the freezing circuit 3112 operates.

In detail, the freezing signal FS of a high level is applied to gates of the seventh transistor TR7 and the eighth transistor TR8, and the seventh transistor TR7 and the eighth transistor TR8 are turned on. As the seventh transistor TR7 and the eighth transistor TR8 are turned on, the second power VS is connected to the sources of the fourth transistor TR4 and the sixth transistor TR6. Voltages Vgs between the gates and the sources of the fourth transistor TR4 and the sixth transistor TR6 become the second power VS. As the voltage differences between the gates and the sources of the fourth transistor TR4 and the sixth transistor TR6 become 0V, the fourth transistor TR4 and the sixth transistor TR6 are turned off.

Accordingly, even though the voltage Vn1 of the first node n1 and the voltage Vn2 of the second node n2 simultaneously drop to low levels in correspondence to the voltage change dv/dt of the second driving voltage of the second power VS, the fourth transistor TR4 and the sixth transistor TR6 are turned off so that no current flows through the first resistor R1 and the second resistor R2, and the first driving signal SC1 of a high level and the second driving signal SC2 of a high level are not generated. That is to say, the first driving signal SC1 of a low level and the second driving signal SC2 of a low level are generated. Therefore, signals inputted to the set terminal S and the reset terminal R of the SR latch 33 are (0,0).

Also, a voltage drop occurs across the seventh resistor R7 in correspondence to the voltage change dv/dt of the second driving voltage of the second power VS. A signal of a low level corresponding to such a voltage drop is applied to the gates of the ninth transistor TR9, the tenth transistor TR10 and the twelfth transistor TR12. According to the signal of a low level, the ninth transistor TR9, the tenth transistor TR10 and the twelfth transistor TR12 are turned on.

As the tenth transistor TR10 is turned on, a bypass path Ro1 including the tenth transistor TR10 is formed between the first power VB and the ground, and a voltage charged in the third parasitic capacitor CPR3 flows through the bypass path Ro1. As the ninth transistor TR9 is turned on, a bypass path Ro2 including the ninth transistor TR9 is formed between the first power VB and the ground, and a voltage charged in the first parasitic capacitor CPR1 flows through the bypass path Ro2. As the twelfth transistor TR12 is turned on, a bypass path Ro3 including the twelfth transistor TR12 is formed between the first power VB and the ground, and a voltage charged in the second parasitic capacitor CPR2 flows through the bypass path Ro3.

According to the bypass path Ro1, the bypass path Ro2 and the bypass path Ro3, a current according to the voltage change dv/dt of the second driving of the second power VS does not flow through the first resistor R1 and the second resistor R2. Accordingly, the first driving signal SC1 of a high level and the second driving signal SC2 of a high level are not generated. In other words, as the first driving signal SC1 of a low level and the second driving signal SC2 of a low level are generated, signals inputted to the set terminal S and the reset terminal R of the SR latch 33 are (0,0).

Therefore, an effect may be achieved in that the level shifter 30 in accordance with the embodiment can prevent the malfunction of the SR latch 33 doubly by using the path forming circuit 312 and the freezing circuit 3112 in correspondence to dv/dt of the second power VS.

Referring to FIG. 6, during a normal operation period Pp before the occurrence of a voltage change, the first gate voltage VG1 rises to a high level H in synchronization with a rising time of the first input signal IN1, and falls to a low level L in synchronization with a falling time of the first input signal IN1.

However, at the third time point T3, a voltage change in which the second driving voltage of the second power VS rises with a steep slope dv/dt occurs, and in correspondence to this, the voltage of the first input signal IN1 rises from a voltage V1 to a voltage V2.

During a voltage change period Pc between the third time point T3 and the fourth time point T4, a voltage change in which the second driving voltage of the second power VS rises with a steep slope dv/dt occurs, and in correspondence to this, the voltage of the first input signal IN1 rises from the voltage V1 to the voltage V2. In response to the voltage change of the voltage of the first input signal IN1, the first parasitic capacitor CPR1, the second parasitic capacitor CPR2 and the third parasitic capacitor CPR3 are charged. The first gate voltage VG1 is outputted as a voltage Vc of a level higher than the high level of the normal operation period Pp in synchronization with a rising time of the first input signal IN1.

Accordingly, during the voltage change period Pc, the first driving signal SC1 of a high level and the second driving signal SC2 of a high level are generated, the set driving signal SSC of a high level is applied to the set terminal S of the SR latch 33, and the reset driving signal RSC of a high level is applied to the reset terminal R of the SR latch 33. Therefore, the SR latch 33 malfunctions.

However, even though the voltage of the first input signal IN1 rises from the voltage V1 to the voltage V2 according to the voltage change of the second driving voltage of the second power VS during the voltage change period Pc, as described above, it is possible to prevent the malfunction of the SR latch 33 doubly by using the path forming circuit 312 and the freezing circuit 3112.

Therefore, during a normal operation period Pa after the fourth time point T4, even though the voltage of the first input signal IN1 rises from the voltage V1 to the voltage V2, the first gate voltage VG1 rises to the high level H in synchronization with a rising time of the first input signal IN1, and falls to the low level L in synchronization with a falling time of the first input signal IN1.

Accordingly, even though the voltage of the first input signal IN1 rises from the first voltage V1 to the second voltage V2, the level shifter 30 in accordance with the embodiment may prevent the malfunction of the SR latch 33 doubly by using the path forming circuit 312 and the freezing circuit 3112.

And, a time required for the voltage drop of a load resistor of a level shifter to exceed a threshold voltage of an inverter may be reduced. Therefore, the level shifter 30 in accordance with the embodiment may quickly change the output state of an SR latch. In addition, the size of an NMOS transistor included in the level shifter 30 in accordance with the embodiment may be reduced.

Hereunder, a method for driving a gate driver in accordance with an embodiment will be described with reference to FIG. 7.

Figure 7:
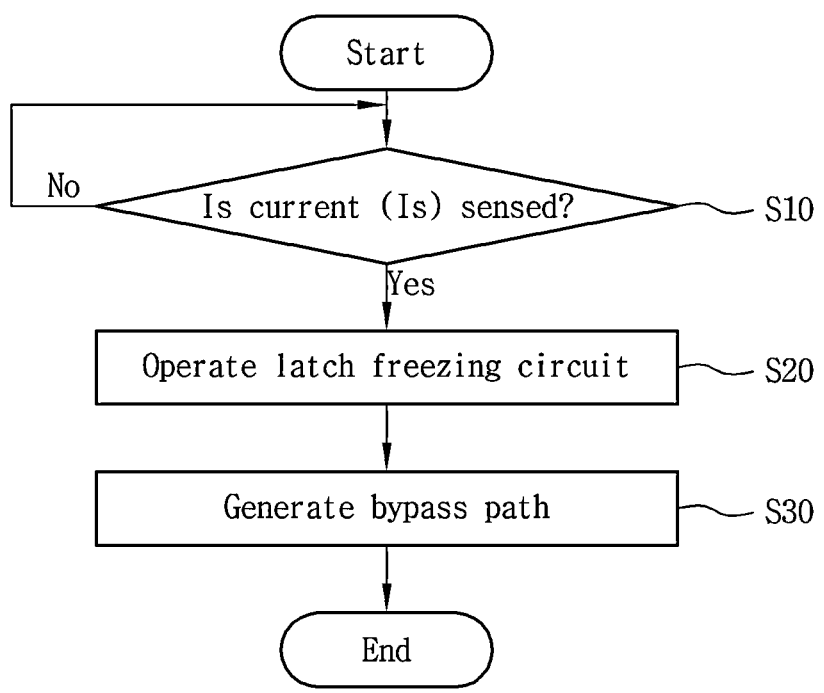
FIG. 7 is a flowchart illustrating a driving method of the gate driver in accordance with the embodiment.

FIG. 7 is a flowchart illustrating a driving method of the gate driver in accordance with the embodiment.

At step S10, the level shifter 30 senses the current Is flowing across the eighth resistor R8 in response to the voltage change dv/dt of the second driving voltage of the second power VS.

At step S20, when the current Is is sensed, the level shifter 30 generates the freezing signal FS of an enable level in response to the sensed current Is. The level shifter 30 turns off the fourth transistor TR4 and the sixth transistor TR6 according to the freezing signal FS of an enable level.

In detail, the freezing signal FS of a high level is applied to the gates of the seventh transistor TR7 and the eighth transistor TR8, and the seventh transistor TR7 and the eighth transistor TR8 are turned on. As the seventh transistor TR7 and the eighth transistor TR8 are turned on, the second power VS is connected to the sources of the fourth transistor TR4 and the sixth transistor TR6. The voltages Vgs between the gates and the sources of the fourth transistor TR4 and the sixth transistor TR6 become the second driving voltage of the second power VS. As the voltage differences between the gates and the sources of the fourth transistor TR4 and the sixth transistor TR6 become 0V, the fourth transistor TR4 and the sixth transistor TR6 are turned off.

Accordingly, even though the first voltage Vn1 of the first node n1 and the second voltage Vn2 of the second node n2 simultaneously drop to low levels in correspondence to the voltage change dv/dt of the second driving voltage of the second power VS, the fourth transistor TR4 and the sixth transistor TR6 are turned off so that no current flows through the first resistor R1 and the second resistor R2, and the first driving signal SC1 of a high level and the second driving signal SC2 of a high level are not generated. That is to say, the first driving signal SC1 of a low level and the second driving signal SC2 of a low level are generated. Therefore, signals inputted to the set terminal S and the reset terminal R of the SR latch 33 are (0,0).

At step S30, the level shifter 30 generates a bypass path Ro so that a latch circuit 33 included in the signal generator 31 does not malfunction in a voltage change.

In detail, a voltage drop occurs across the seventh resistor R7 in correspondence to the voltage change dv/dt of the second driving voltage of the second power VS. A signal of a low level corresponding to such a voltage drop is applied to the gates of the ninth transistor TR9, the tenth transistor TR10 and the twelfth transistor TR12. According to the signal of a low level, the ninth transistor TR9, the tenth transistor TR10 and the twelfth transistor TR12 are turned on.

As the tenth transistor TR10 is turned on, the bypass path Ro1 including the tenth transistor TR10 is formed between the first power VB and the ground, and a voltage charged in the third parasitic capacitor CPR3 flows through the bypass path Ro1. As the ninth transistor TR9 is turned on, the bypass path Ro2 including the ninth transistor TR9 is formed between the first power VB and the ground, and a voltage charged in the first parasitic capacitor CPR1 flows through the bypass path Ro2. As the twelfth transistor TR12 is turned on, the bypass path Ro3 including the twelfth transistor TR12 is formed between the first power VB and the ground, and a voltage charged in the second parasitic capacitor CPR2 flows through the bypass path Ro3.

According to the bypass path Ro1, the bypass path Ro2 and the bypass path Ro3, a current according to the voltage change dv/dt of the second driving voltage of the second power VS does not flow through the first resistor R1 and the second resistor R2. Accordingly, the first driving signal SC1 of a high level and the second driving signal SC2 of a high level are not generated.

According to the bypass path Ro1, the bypass path Ro2 and the bypass path Ro3, a current according to dv/dt of the second power VS does not flow through the first resistor R1 and the second resistor R2. Accordingly, the first driving signal SC1 of a high level and the second driving signal SC2 of a high level are not generated. That is to say, the first driving signal SC1 of a low level and the second driving signal SC2 of a low level are generated. Thus, signals inputted to the set terminal S and the reset terminal R of the SR latch 33 are (0,0).

Therefore, an effect may be achieved in that the level shifter 30 in accordance with the embodiment can prevent the malfunction of the SR latch 33 doubly by using the path forming circuit 312 and the freezing circuit 3112 in correspondence to the voltage change dv/dt of the second driving voltage of the second power VS. Also, the level shifter 30 in accordance with the embodiment may change the state of the output signal VG1 of the SR latch 33 even with a small voltage drop due to a voltage change in which the second power VS instantaneously rises with a steep slope of the voltage change dv/dt of the second driving voltage of the second power VS.

Accordingly, a time required for the voltage drop of a load resistor of a level shifter to exceed a threshold voltage of an inverter so as to change the state of an SR latch may be reduced. Therefore, the level shifter 30 in accordance with the embodiment may quickly change the output state of an SR latch when compared to the conventional art. In addition, the size of an NMOS transistor included in the level shifter 30 in accordance with the embodiment may be reduced.

While various embodiments have been described above, it will be understood to those skilled in the art that the embodiments described are by way of example only. Accordingly, the disclosure described herein should not be limited based on the described embodiments.

What is claimed is:

1. A level shifter comprising:
a first resistor and a first transistor which are connected between first power and second power and generate a first voltage;
a second resistor and a second transistor which are connected between the first power and the second power and generate a second voltage;
a converter configured to generate a first driving signal by using the first voltage of a first node between the first resistor and the first transistor and a second driving signal by using the second voltage of the second node between the second resistor and the second transistor;
a current sensing circuit configured to detect a first current flows between the first power and the second power corresponding to a voltage change of the second power, and generate a freezing signal according to the voltage change; and
a freezing circuit configured to control an operation of the converter according to the freezing signal;
wherein a gate voltage is provided in response to the first driving signal and the second driving signal,
wherein the converter comprises:
a third transistor and a fourth transistor connected in series between the first power and the second power;
a third resistor connected to the first power and one end of the third transistor;
a fourth resistor connected to the second power and one end of the fourth transistor,
a fifth transistor and a sixth transistor connected in series between the first power and the second power;
a fifth resistor connected to the first power and one end of the fifth transistor; and
a sixth resistor connected to the second power and one end of the sixth transistor,
wherein a gate of the third transistor and a gate of the fourth transistor are connected to the second node, and
wherein a gate of the fifth transistor and a gate of the sixth transistor are connected to the first node.

2. The level shifter according to claim 1, wherein the current sensing circuit comprises:
a sensing resistor which is connected between the first power and the second power and through which the first current flows; and
a current sensing part configured to detect the first current and generate the freezing signal,
wherein the freezing signal which controls the operation of the converter, when the first current is detected.

3. The level shifter according to claim 1, wherein the freezing circuit comprises:

a seventh transistor connected in parallel to the fourth resistor, and having a gate to which the freezing signal is applied; and
an eighth transistor connected in parallel to the sixth resistor, and having a gate to which the freezing signal is applied.

4. The level shifter according to claim 3, wherein
the seventh transistor and the eighth transistor are simultaneously turned on by the freezing signal of an enable level.

5. The level shifter according to claim 4 the level shifter further comprises:
a path forming circuit configured to form bypass paths for the first node and the second node.

6. The level shifter according to claim 5, wherein the path forming circuit comprises:
a ninth transistor connected between the first power and the first node;
a tenth transistor connected between the first power and the second node, and
a seventh resistor connected between the first power and a third node connected to the gates of the ninth transistor and the tenth transistor,
wherein a gate of the ninth transistor and a gate of the tenth transistor are connected to each other.

7. The level shifter according to claim 6, wherein the path forming circuit further comprises:
an eleventh transistor providing the bypath path between the ground and the third node.

8. The level shifter according to claim 6, wherein
the ninth transistor and the tenth transistor are simultaneously turned on according to a voltage drop of the seventh resistor, and
the bypass path comprises:
a first bypass path formed through the tenth transistor; and
a second bypass path formed through the ninth transistor.

9. A gate driver comprising:
a pulse generator configured to generate a first pulse signal in synchronization with a first input signal and a second pulse signal in synchronization with a second input signal; and
a level shifter configured to generate a first driving signal and a second driving signal corresponding to the first pulse signal and the second pulse signal;
wherein the level shifter including:
a first resistor and a first transistor which are connected between first power and second power and generate a first voltage;
a second resistor and a second transistor which are connected between the first power and the second power and generate a second voltage;
a converter configured to generate the first driving signal by using the first voltage of a first node between the first resistor and the first transistor and the second driving signal by using by using the second voltage of the second node between the second resistor and the second transistor;
an SR latch configured to generate a gate voltage according to the first driving signal and the second driving signal;
a current sensing circuit configured to detect a voltage change of the second driving voltage of the second power, and generate a freezing signal according to the voltage change; and
a freezing circuit configured to control an operation of the converter according to the freezing signal;

wherein the first transistor receives the first pulse signal and the second transistor receives the second pulse signal, wherein the converter comprises:
a third transistor and a fourth transistor connected in series between the first power and the second power;
a third resistor connected to the first power and one end of the third transistor;
a fourth resistor connected to the second power and one end of the fourth transistor,
a fifth transistor and a sixth transistor connected in series between the first power and the second power;
a fifth resistor connected to the first power and one end of the fifth transistor; and
a sixth resistor connected to the second power and one end of the sixth transistor,
wherein a gate of the third transistor and a gate of the fourth transistor are connected to the second node, and
wherein a gate of the fifth transistor and a gate of the sixth transistor are connected to the first node.

10. The gate driver according to claim 9, wherein the current sensing circuit comprises:
a sensing resistor which is connected between the first power and the second power and through which a first current flows; and
a current sensing part configured to detect the first current corresponding to the voltage change of the second power,
wherein the current sensing part generates the freezing signal which controls the operation of the converter, when the first current is detected.

11. The gate driver according to claim 9, wherein the freezing circuit comprises:
a seventh transistor connected in parallel to the fourth resistor, and having a gate to which the freezing signal is applied; and
an eighth transistor connected in parallel to the sixth resistor, and having a gate to which the freezing signal is applied.

12. The gate driver according to claim 11, wherein
the seventh transistor and the eighth transistor are simultaneously turned on by the freezing signal of an enable level.

13. The level shifter according to claim 9, the level shifter further comprises:
a path forming circuit configured to form bypass paths for the first node and the second node.

14. The gate driver according to claim 13, wherein the path forming circuit comprises:
a ninth transistor connected between the first power and the first node;
a tenth transistor connected between the first power and the second node, and
a seventh resistor connected between the first power and a third node connected to the gates of the ninth transistor and the tenth transistor,
wherein a gate of the ninth transistor and a gate of the tenth transistor are connected to each other.

15. The gate driver according to claim 14, wherein the path forming circuit further comprises:
an eleventh transistor providing the bypath path between the ground and the third node.

16. The gate driver according to claim 14, wherein
the ninth transistor and the tenth transistor are simultaneously turned on according to a voltage drop of the seventh resistor, and
the bypass path comprises:
a first bypass path formed through the tenth transistor; and
a second bypass path formed through the ninth transistor.

* * * * *